(12) United States Patent
Chen et al.

(10) Patent No.: US 9,445,509 B2
(45) Date of Patent: Sep. 13, 2016

(54) THREE-DIMENSIONAL BACKPLANE

(71) Applicant: Huawei Technologies Co., Ltd., Shenzhen, Guangdong (CN)

(72) Inventors: Songhai Chen, Shenzhen (CN); Shiping Tang, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 320 days.

(21) Appl. No.: 14/056,407

(22) Filed: Oct. 17, 2013

(65) Prior Publication Data

US 2014/0111957 A1 Apr. 24, 2014

(30) Foreign Application Priority Data

Oct. 19, 2012 (CN) .......................... 2012 1 0400937

(51) Int. Cl.
*H05K 1/11* (2006.01)
*H05K 3/36* (2006.01)
*H04L 12/931* (2013.01)

(52) U.S. Cl.
CPC ............... *H05K 3/366* (2013.01); *H04L 49/40* (2013.01); *H05K 2201/044* (2013.01)

(58) Field of Classification Search
CPC ....... H01K 1/11; H01R 12/00; H01R 13/193
USPC ........ 361/785, 780, 784, 788; 174/250, 261, 174/262
See application file for complete search history.

(56) References Cited

U.S. PATENT DOCUMENTS 6,181,570 B1 * 1/2001 Ellebrecht ............ H05K 7/1422
361/752
6,866,518 B1 * 3/2005 Korsunsky ........... H01R 13/193
439/61

(Continued)

FOREIGN PATENT DOCUMENTS

| CN | 1599144 A | 3/2005 |
| CN | 101262355 A | 9/2008 |
| CN | 101895423 A | 11/2010 |
| CN | 101984599 A | 3/2011 |

(Continued)

OTHER PUBLICATIONS

Young et al., "Physical Design Issues for Very Large ATM Switching Systems," Globecom '90 IEEE Global Telecommunications Conference & Exhibition, Conference Record vol. 3 of 3, IEEE, San Diego, California (Dec. 2-5, 1990).

*Primary Examiner* — Jenny L Wagner
*Assistant Examiner* — Michael P McFadden
(74) *Attorney, Agent, or Firm* — Leydig, Voit & Mayer, Ltd.

(57) ABSTRACT

An objective of the present invention is to provide a three-dimensional backplane to solve the problem that the number of layers of a printed circuit board for producing a backplane increases linearly along with the number of connectors. The three-dimensional backplane includes: a first group of connectors, a second group of connectors, a first group of printed circuit boards, and a second group of printed circuit boards. Any printed circuit board in the first group of printed circuit boards is connected to any printed circuit board in the second group of printed circuit boards. Any connector in the second group of connectors is connected to any connector in the first group of connectors. With the foregoing solution, the number of wires on each printed circuit board is reduced, so that the number of layers of a printed circuit board for producing a backplane is reduced.

6 Claims, 6 Drawing Sheets

(56) References Cited

U.S. PATENT DOCUMENTS

2004/0092168 A1* 5/2004 Vadasz ................ H01R 12/721
439/631
2013/0107489 A1 5/2013 Wen et al.
2015/0049451 A1 2/2015 Wang et al.

FOREIGN PATENT DOCUMENTS

| CN | 102695393 A | 9/2012 |
|---|---|---|
| EP | 2175587 A1 | 4/2010 |
| EP | 2568537 A1 | 3/2013 |
| WO | WO 2011137828 A1 | 11/2011 |

* cited by examiner

THREE-DIMENSIONAL BACKPLANE

CROSS-REFERENCE TO RELATED APPLICATION

This application claims priority to Chinese Patent Application No. 201210400937.9, filed on Oct. 19, 2012, which is hereby incorporated by reference in its entirety.

FIELD OF THE INVENTION

The present invention relates to the field of electrical components, and in particular, to a three-dimensional backplane.

BACKGROUND OF THE INVENTION

Such devices as a router and a network switch generally consist of a line card circuit on a line card board and a switched fabric circuit (abbreviated as fabric circuit), for example, a fabric application-specific integrated circuit (fabric ASIC), on a switched fabric board (abbreviated as fabric board). To implement a nonblocking cross-connect between line card circuits and switched fabric circuits in the router or the network switch, the line card circuits and the switched fabric circuits need to be fully interconnected to each other.

Generally, for the router and the network switch, a backplane is used to implement an interconnection between the line card circuit and the switched fabric circuit. FIG. 1 is a schematic diagram of a backplane that implements a full interconnection between the line card circuits and the switched fabric circuits. The backplane illustrated in FIG. 1 provides three connectors, that is, a connector S1, a connector S2, and a connector S3, connected to the switched fabric circuit; and three connectors, that is, a connector L1, a connector L2, and a connector L3, connected to the line card circuit. Any connector connected to the switched fabric circuits on the backplane is connected to all connectors connected to the line card circuits. Similarly, any connector connected to the line card circuits on the backplane is connected to all connectors connected to the switched fabric circuits. The backplane is generally produced by using a printed circuit board (PCB). Because the wires on the printed circuited board cannot be intersected, the backplane generally implements a full interconnection between the line card circuits and the switched fabric circuits by using a multilayer printed circuit board.

In FIG. 1, the line card circuit is disposed on a line card board, and the switched fabric circuit is disposed on a switched fabric board. In actual applications, the line card circuit and the switched fabric circuit may also be disposed on different boards.

As the number of desired connectors connected to the line card circuits and the switched fabric circuits increases, the number of layers and the size of the printed circuit board for producing the backplane increase linearly. A common printed circuit board process may not meet the requirement for a backplane that provides a great number of connectors.

SUMMARY OF THE INVENTION

An objective of the present invention is to provide a three-dimensional backplane to solve the problem that the number of layers of a printed circuit board for producing a backplane increases linearly along with the number of connectors.

A first aspect of the present invention provides a three-dimensional backplane. The three-dimensional backplane includes a first group of connectors, a second group of connectors, a first group of printed circuit boards, and a second group of printed circuit boards. The first group of connectors include at least two connectors; the second group of connectors include at least two connectors; the first group of printed circuit boards include at least two printed circuit boards, or the second group of printed circuit boards include at least two printed circuit boards; the first group of connectors are disposed on the first group of printed circuit boards; the second group of connectors are disposed on the second group of printed circuit boards; any printed circuit board in the first group of printed circuit boards is connected to all printed circuit boards in the second group of printed circuit boards; any printed circuit board in the second group of printed circuit boards is connected to all printed circuit boards in the first group of printed circuit boards; any connector in the first group of connectors is connected to all connectors in the second group of connectors through all connections between a printed circuit board, where the connector is disposed, in the first group of printed circuit boards and all printed circuit boards in the second group of printed circuit boards; and any connector in the second group of connectors is connected to all connectors in the first group of connectors through all connections between a printed circuit board, where the connector is disposed, in the second group of printed circuit boards and all printed circuit boards in the first group of printed circuit boards.

In the foregoing solution, connectors are deployed on at least two printed circuit boards, and wires on each printed circuit board are reduced, thereby reducing the number of layers of a printed circuit board for producing a backplane.

DETAILED DESCRIPTION OF THE EMBODIMENTS

The following describes embodiments of the present invention with reference to FIG. 2 to FIG. 6.

Figure 1:
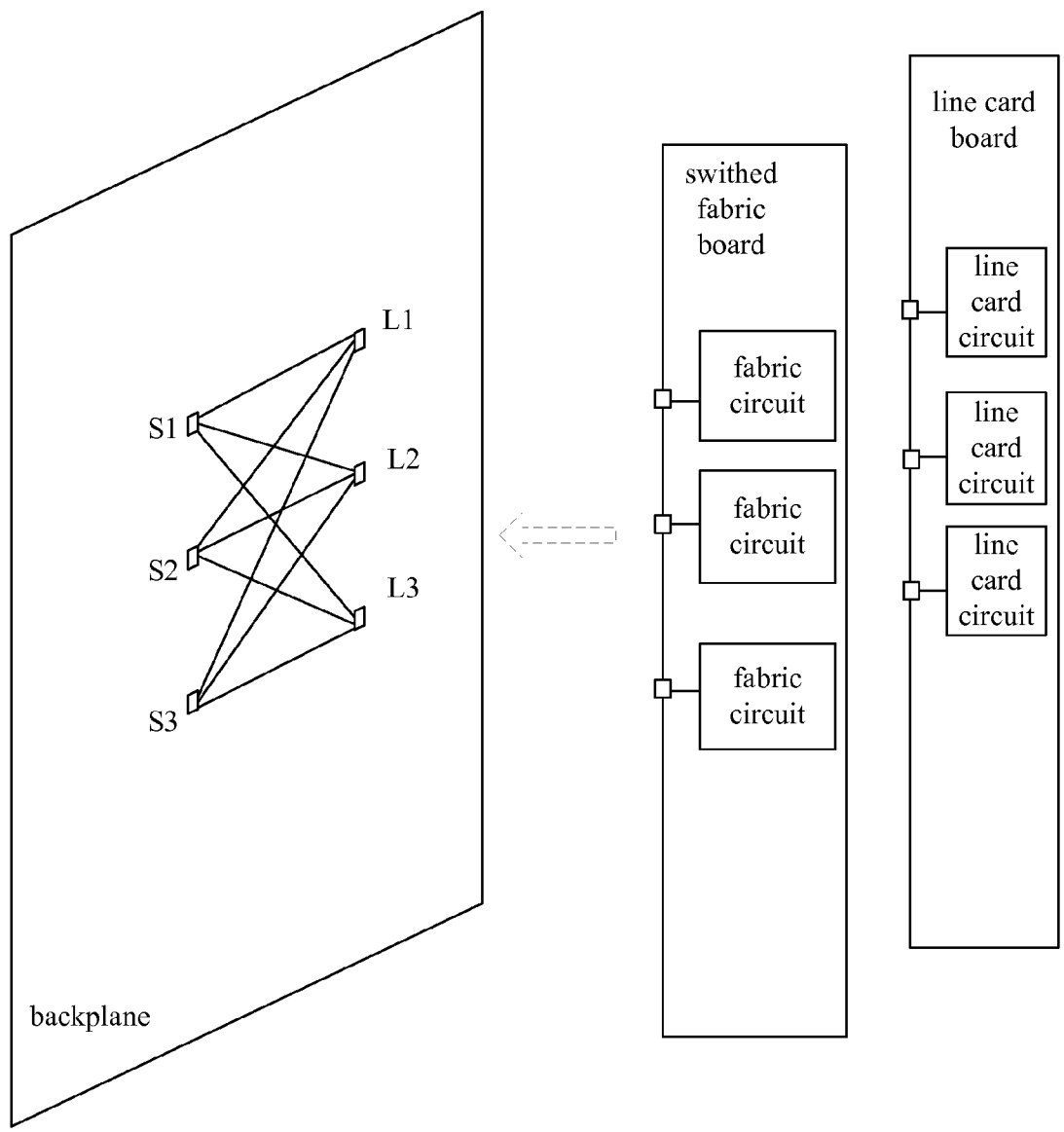
FIG. 1 is a schematic diagram of a common backplane.
Figure 2:
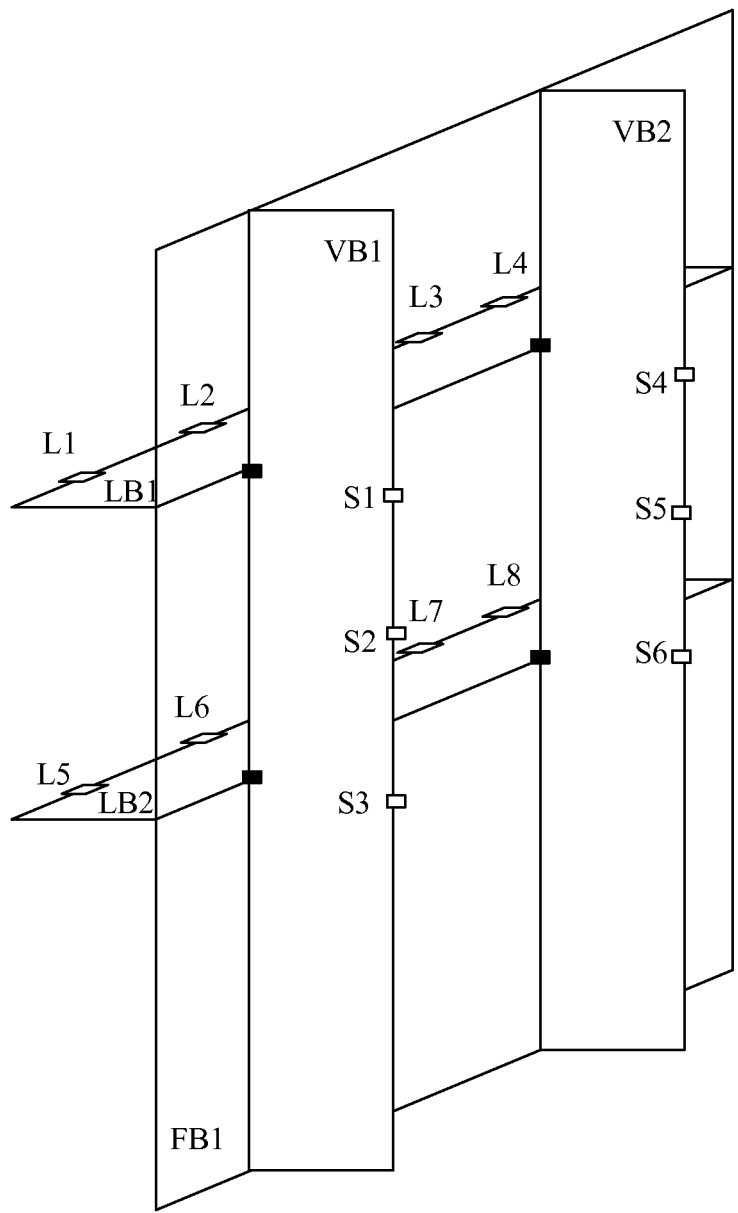
FIG. 2 is a schematic diagram of a three-dimensional backplane according to an embodiment of the present invention.

FIG. 2 is a schematic diagram of a three-dimensional backplane according to an embodiment of the present invention. The three-dimensional backplane includes:

a first group of connectors, that is, a connector S1 to a connector S6, a second group of connectors, that is, a connector L1 to a connector L8, a first group of printed circuit boards, that is, printed circuit boards VB1 and VB2, and a second group of printed circuit boards, that is, printed circuit boards LB1 and LB2.

The first group of connectors includes at least two connectors. The first group of connectors is connected to one or multiple switched fabric boards, and connectors in the first group of connectors are connected to a switched fabric circuit. The second group of connectors includes at least two connectors. The second group of connectors is connected to one or multiple line card boards, and connectors in the second group of connectors are connected to a line card circuit.

In this embodiment of the present invention, to reduce the wires on a printed circuit board and further reduce the number of layers and the size of a printed circuit board for producing a backplane, connectors are deployed on at least two printed circuit boards. Therefore, the first group of printed circuit boards includes at least two printed circuit boards, or the second group of printed circuit boards includes at least two printed circuit boards. Further, the first group of printed circuit boards and the second group of printed circuit boards may include two or more printed circuit boards respectively to further reduce the number of layers and the size of the printed circuit board for producing the backplane. The first group of printed circuit boards and the second group of printed circuit boards may include different numbers of printed circuit boards, for example, the first group of printed circuit boards includes two printed circuit boards and the second group of printed circuit boards includes four printed circuit boards.

The first group of connectors is disposed on the first group of printed circuit boards. In one possible implementation of this embodiment of the present invention, the connector S1 to the connector S3 in the first group of connectors are disposed on the printed circuit board VB1 in the first group of printed circuit boards, and the connectors S4 to S6 in the first group of connectors are disposed on the printed circuit board VB2 in the first group of printed circuit boards. In this embodiment of the present invention, the first group of connectors may be disposed at any part of the first group of printed circuit boards. In FIG. 2, the first group of connectors is disposed at the edge of the first group of printed circuit boards.

The second group of connectors is disposed on the second group of printed circuit boards. In a specific implementation of this embodiment of the present invention, the connector L1 to the connector L4 in the second group of connectors are disposed on the printed circuit board LB1 in the second group of printed circuit boards, and the connector L5 to the connector L8 in the second group of connectors are disposed on the printed circuit board LB2 in the second group of printed circuit boards. In this embodiment of the present invention, the second group of connectors may be disposed at any part of the second group of printed circuit boards. In FIG. 2, the second group of connectors is disposed at the edge of the second group of printed circuit boards.

Optionally, in a case where the first group of printed circuit boards include at least two printed circuit boards, all the printed circuit boards in the first group of printed circuit boards are parallel to each other; when the second group of printed circuit boards include at least two printed circuit boards, all the printed circuit boards in the second group of printed circuit boards are parallel to each other. For example, as shown in FIG. 2, the printed circuit board VB1 is parallel to the printed circuit board VB2, and the printed circuit board LB1 is parallel to the printed circuit board LB2.

Any printed circuit board in the first group of printed circuit boards is connected to all printed circuit boards in the second group of printed circuit boards; any printed circuit board in the second group of printed circuit boards is connected to all printed circuit boards in the first group of printed circuit boards. For example, the printed circuit board VB1 in the first group of printed circuit boards is connected, at an upper left black block and a lower left black block illustrated in FIG. 2, to all printed circuit boards, that is, the printed circuit board LB1 and the printed circuit board LB2, in the second group of printed circuit boards respectively. The connection between the first group of printed circuit boards and the second group of printed circuit boards may be a direct connection between the printed circuit boards, and may also be an indirect connection, for example, connecting through an additional connector or a wire wrap.

Optionally, when the number of circuit boards in the first group of printed circuit boards and the number of the second group of printed circuit boards are large, to ensure the connections between the first group of printed circuit boards and the second group of printed circuit boards, the first group of printed circuit boards that are parallel to each other may be perpendicular to the second group of printed circuit boards that are parallel to each other. For example, as shown in FIG. 2, the printed circuit board VB1 and the printed circuit board VB2 are vertical, and the printed circuit board LB1 and the printed circuit board LB2 are horizontal.

Any connector in the first group of connectors is connected to all connectors in the second group of connectors through all connections between a printed circuit board, where the connector is disposed, in the first group of printed circuit boards and all printed circuit boards in the second group of printed circuit boards; any connector in the second group of connectors is connected to all connectors in the first group of connectors through all connections between a printed circuit board, where the connector is disposed, in the second group of printed circuit boards and all printed circuit boards in the first group of printed circuit boards. Connections between the connectors are implemented by using wires on the printed circuit boards. Specific wires on the printed circuit boards are not marked in FIG. 2, and reference may be made to FIG. 3 and FIG. 4.

Figure 3:
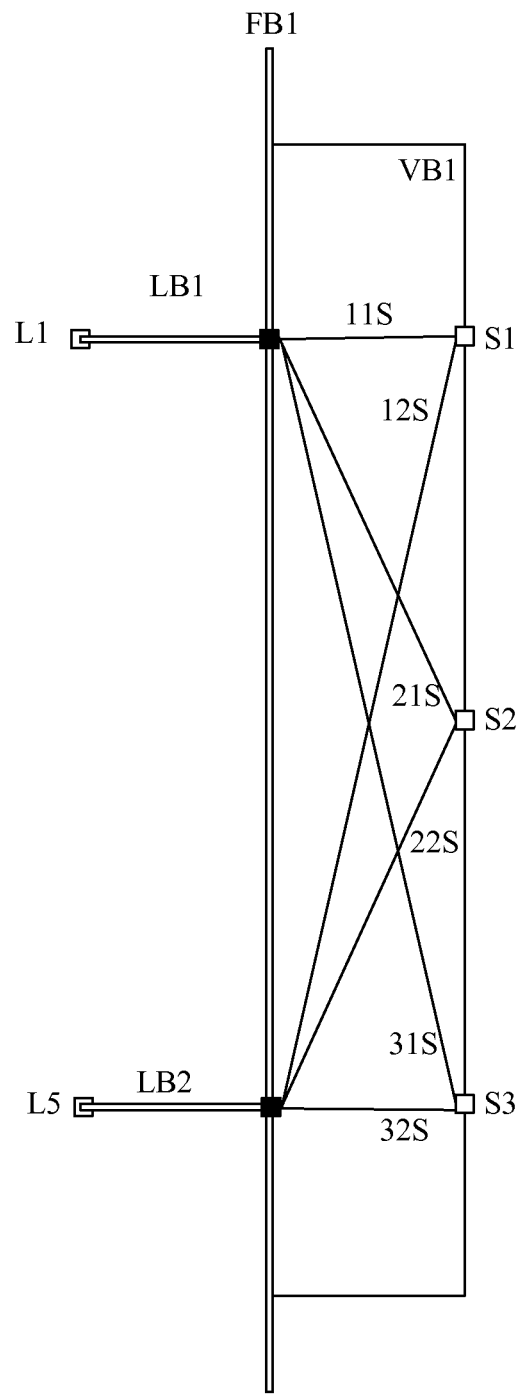
FIG. 3 is a schematic diagram of a layout of wires on a first group of printed circuit boards according to an embodiment of the present invention.
Figure 4:
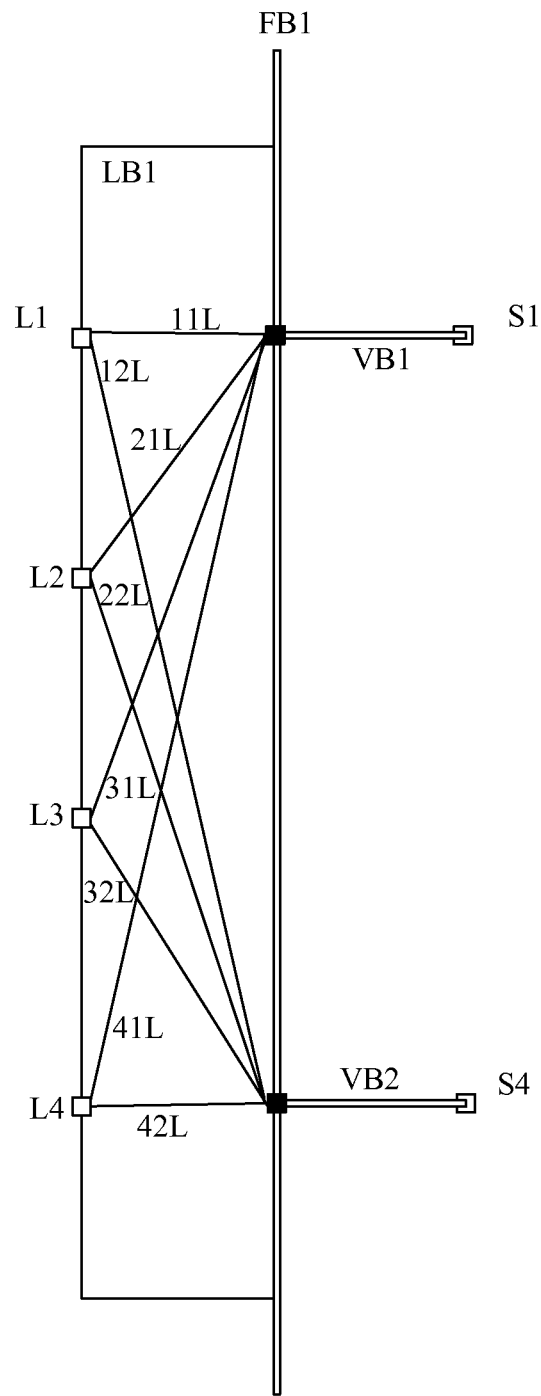
FIG. 4 is a schematic diagram of a layout of wires on a second group of printed circuit boards according to an embodiment of the present invention.

FIG. 3 is a schematic diagram of a layout of wires on a first group of printed circuit boards according to an embodiment of the present invention. FIG. 4 is a schematic diagram of a layout of wires on a second group of printed circuit boards according to an embodiment of the present invention.

The following describes a layout mode of wires on a printed circuit board with an example of a connection from a connector S1 to a connector L4. In FIG. 3, a wire 11S of a connector S1 on a printed circuit board VB1 starts from the connector S1 to a junction of the printed circuit board VB1 and a printed circuit board LB1, that is, to the upper black block illustrated in FIG. 3, that is, the upper left black block illustrated in FIG. 2. In FIG. 4, a wire 41L of a connector L4 on the printed circuit board LB1 starts from the connector L4 to the junction of the printed circuit board VB1 and the printed circuit board LB1, that is, to the upper black block illustrated in FIG. 4, that is, the upper left black block illustrated in FIG. 2. With reference to FIG. 3 and FIG. 4, the connector S1 is connected to the connector L4 through the junction of the printed circuit board VB1 and the printed circuit board LB1. Similarly, the connector S1 is connected to the connector L1 to the connector L3 through the junction of the printed circuit board VB1 and the printed circuit board LB1; the connector S1 is connected to the connector L5 to the connector L8 through a junction of the printed circuit board VB1 and the printed circuit board LB2. That is, the connector S1 is connected to the connectors L1 to L8 through all connections between the printed circuit board VB1 and all printed circuit boards in the second group of printed circuit boards.

Each wire illustrated in FIG. 3 and FIG. 4, that is, a wire 11S to a wire 32S illustrated in FIG. 3, and a wire 11L to a wire 42L illustrated in FIG. 4, indicates only a logical connection relationship rather than an actual physical layout. In addition, a wire in FIG. 3 and FIG. 4 may be a collection of multiple actual wires. For example, on the printed circuit board VB1, the layout of the wires from the connector S1 to the connector L1 and from the connector S1 to the connector L2 are all represented by the wire 11S illustrated in FIG. 3, but the actual physical layout may be deployed separately and may be close parallel wires.

Figure 5:
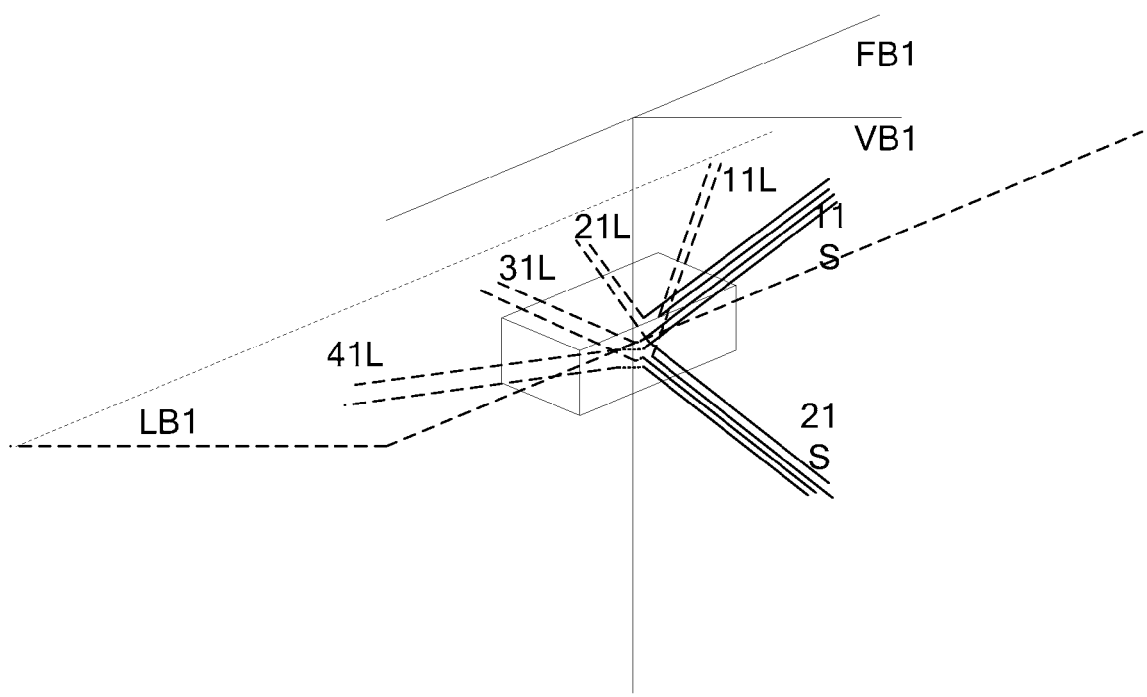
FIG. 5 is a physical layout of wires in one possible implementation according to an embodiment of the present invention.

FIG. 5 illustrates a physical layout of wires in one possible implementation of this embodiment of the present invention. The physical layout illustrated in FIG. 5 refers to the physical layout, of the 11S, 21S and 11L to 41L illustrated in FIG. 3 and FIG. 4, close to a junction of the two groups of printed circuit boards. The physical layout illustrated in FIG. 5 adopts a layout mode of close parallel wires. Each of the 11S and the 21S consists of four wires. The 11S and the 21S are disposed on the printed circuit board VB1. The four wires of the 11S are separated into the 11L to the 41L after passing through the junction of the two groups of printed circuit boards. Each of the 11L to the 41L consists of two wires. Besides the wire coming from the 11S, the other wire in a group of wires consists any one of the 11L to the 41L coming from the 21S.

Optionally, as shown in FIG. 2, the three-dimensional backplane provided in the embodiment of the present invention may further include a fixing board FB1. The fixing board is configured to fix the structure of the three-dimensional backplane, that is, the first group of printed circuit boards and the second group of printed circuit boards are fixed on the fixing board. The first group of printed circuit boards and the second group of printed circuit boards are connected through the fixing board. In one possible implementation of this embodiment of the present invention, the fixing board is a board perpendicular to the first group of printed circuit boards and perpendicular to the second group of printed circuit boards. The fixing board may not be a printed circuit board. In combination with the foregoing possible implementation, in another possible implementation of this embodiment of the present invention, a third group of connectors are disposed on the fixing board. The first group of printed circuit boards and the second group of printed circuit boards are connected through the third group of connectors. Any connector in the first group of connectors is connected to all connectors in the second group of connectors through the third group of connectors. Any connector in the second group of connectors is connected to all connectors in the first group of connectors through the third group of connectors. The first group of printed circuit boards and the second group of printed circuit boards are inserted on the fixing board to form the three-dimensional backplane. In this possible implementation, the first group of printed circuit boards and the second group of printed circuit boards may be produced separately to reduce the difficulty in producing the three-dimensional backplane. In this embodiment of the present invention, the three-dimensional backplane may also be produced at one time in other manner, for example, a three-dimensional printing (3D printing) manner.

The structure of the three-dimensional backplane may be fixed in another manner other than the fixing board. For example, a fixed structure, for example, an enclosure, may be added at external sides of the first group of printed circuit boards and the second group of printed circuit boards to fix the structure of the three-dimensional backplane.

Figure 6:
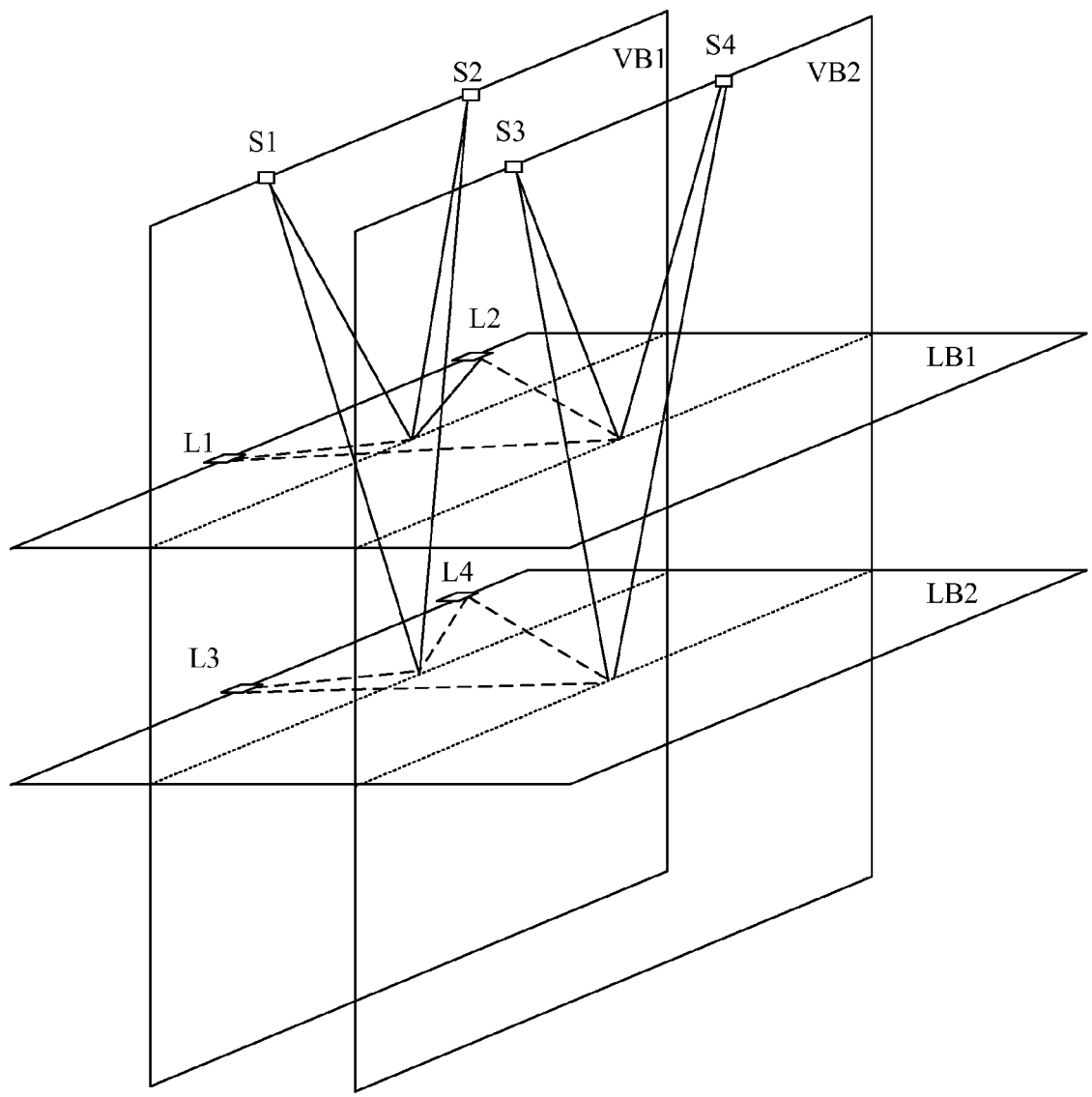
FIG. 6 is a schematic diagram of a three-dimensional backplane in another possible implementation according to an embodiment of the present invention.

In addition, the three-dimensional backplane may also be fixed by using the structures of the first group of printed circuit boards and the second group of printed circuit boards. As shown in FIG. 6, FIG. 6 is a schematic diagram of a three-dimensional backplane fixed by using structures of a first group of printed circuit boards and a second group of printed circuit boards in another possible implementation of this embodiment of the present invention.

In this implementation, the first group of printed circuit boards and the second group of printed circuit boards both include at least two printed circuit boards.

The first group of printed circuit boards intersects with the second group of printed circuit boards, and the intersection part is used to fix the structure of the three-dimensional backplane. To fix the structure of the three-dimensional backplane, the length of the intersection part should be able to ensure the firmness of the structure of the three-dimensional backplane, for example, the length of the intersection part is the width of the printed circuit board or is more than one third of the width of the printed circuit board. In FIG. 6, a printed circuit board VB1 and a printed circuit board VB2 in the first group of printed circuit boards fully intersect with a printed circuit board LB1 and a printed circuit board LB2 in the second group of printed circuit boards, so that the three-dimensional backplane is fixed by using the structures of the first group of printed circuit boards and the second group of printed circuit boards.

Optionally, all the printed circuit boards in the first group of printed circuit boards are parallel to each other, and all the printed circuit boards in the second group of printed circuit boards are parallel to each other.

Further, optionally, to ensure the connections between the first group of printed circuit boards and the second group of printed circuit boards, the first group of printed circuit boards that are parallel to each other may be perpendicular to the second group of printed circuit boards that are parallel to each other.

In FIG. 6, wires on the first group of printed circuit boards are represented by solid wires, wires on the second group of printed circuit boards are represented by long dashed lines, and joints between the first group of printed circuit boards and the second group of printed circuit boards are represented by short dashed lines.

The three-dimensional backplane provided in the implementation of this embodiment of the present invention illustrated in FIG. 6 may further reduce the wire deployment difficulty. Because the joints between the first group of printed circuit boards and the second group of printed circuit boards are relatively long, physical locations of connections between the wires on the first group of printed circuit boards and the wires on the second group of printed circuit boards may be in the middle of multiple connectors on the printed circuit boards, for example, the junction on the VB1 illustrated in FIG. 6 is disposed between S1 and S2. Therefore, the wires on the VB1 are not intersected logically. On the three-dimensional backplane illustrated in FIG. 6, the number of logical intersections between the wires on the printed circuit boards can be reduced to the number of logic intersections on the three-dimensional backplane illustrated in FIG. 2 where the number of connectors provided by the three-dimensional backplane illustrated in FIG. 2 is only half that provided by this implementation. That is, by using the three-dimensional backplane illustrated in FIG. 6, the number of layers of a printed circuit board for producing a backplane may be further reduced.

In this embodiment of the present invention, connectors are deployed on at least two printed circuit boards, and the number of wires on each printed circuit board is reduced, so that the number of layers and the size of the printed circuit board for producing the backplane are reduced. In addition, by using the three-dimensional backplane provided in this embodiment of the present invention, the space is fully utilized, and the volumes of equipment using the three-dimensional backplane are reduced.

The foregoing descriptions are merely exemplary specific embodiments of the present invention, but are not intended to limit the protection scope of the present invention. Any variation or replacement figured out by persons skilled in the art within the technical scope disclosed in the present invention shall fall within the protection scope of the present invention. Therefore, the protection scope of the present invention shall be subject to the protection scope claimed by the claims.

What is claimed is:

1. A three-dimensional backplane, comprising:
a first group of electrical connectors, a second group of electrical connectors, a first group of printed circuit boards, and a second group of printed circuit boards, wherein:
the first group of electrical connectors comprises at least two electrical connectors;
the second group of electrical connectors comprises at least two electrical connectors;
the first group of printed circuit boards comprises at least two printed circuit boards, or the second group of printed circuit boards comprises at least two printed circuit boards;
the first group of connectors is disposed on the first group of printed circuit boards;
the second group of connectors is disposed on the second group of printed circuit boards;
each printed circuit board in the first group of printed circuit boards is connected to all printed circuit boards in the second group of printed circuit boards;
each printed circuit board in the second group of printed circuit boards is connected to all printed circuit boards in the first group of printed circuit boards;
each electrical connector in the first group of electrical connectors is connected to all electrical connectors in the second group of electrical connectors through all connections between a printed circuit board, where the electrical connector is disposed, in the first group of printed circuit boards and all printed circuit boards in the second group of printed circuit boards;
each electrical connector in the second group of electrical connectors is connected to all electrical connectors in the first group of electrical connectors through all connections between a printed circuit board, where the electrical connector is disposed, in the second group of printed circuit boards and all printed circuit boards in the first group of printed circuit boards;
wherein:
when the first group of printed circuit boards comprise at least two printed circuit boards, all printed circuit boards in the first group of printed circuit boards are parallel to each other; and
when the second group of printed circuit boards comprises at least two printed circuit boards, all printed circuit boards in the second group of printed circuit boards are parallel to each other;
wherein the first group of printed circuit boards are perpendicular to the second group of printed circuit boards;
wherein the three-dimensional backplane further comprises a fixing board; and
wherein the first group of printed circuit boards and the second group of printed circuit boards are fixed on the fixing board.

2. The three-dimensional backplane according to claim 1, wherein the first group of printed circuit boards and the second group of printed circuit boards are connected through the fixing board.

3. The three-dimensional backplane according to claim 1, wherein:
the first group of printed circuit boards and the second group of printed circuit boards are connected through a third group of electrical connectors on the fixing board;
each electrical connector in the first group of electrical connectors is connected to all electrical connectors in the second group of electrical connectors through the third group of electrical connectors; and
each electrical connector in the second group of electrical connectors is connected to all electrical connectors in the first group of electrical connectors through the third group of electrical connectors.

4. The three-dimensional backplane according to claim 1, wherein:
the first group of printed circuit boards comprises at least two printed circuit boards and the second group of printed circuit boards comprises at least two printed circuit boards; and
the first group of printed circuit boards intersects with the second group of printed circuit boards, and an intersection part is used to fix the first and second groups of printed circuit boards onto the structure of the three-dimensional backplane.

5. The three-dimensional backplane according to claim 1, wherein the first group of electrical connectors is disposed at an edge of the first group of printed circuit boards.

6. The three-dimensional backplane according to claim 1, wherein the second group of electrical connectors is disposed at an edge of the second group of printed circuit boards.

* * * * *